Nov. 9, 1965

W. G. DE VERTER 3,216,643

FOAM FLUXING APPARATUS

Filed July 13, 1962

INVENTOR.
WALTON DeVERTER 3,216,643
FOAM FLUXING APPARATUS

Walton G. De Verter, 1708 W. Belmont, Chicago, Ill.

Filed July 13, 1962, Ser. No. 209,704
8 Claims. (Cl. 228—37)

This invention relates in general to flux applicators and in particular to foam fluxing apparatus for use in automatic in-line printed circuit soldering equipment.

Printed circuits present complex and intricate patterns of numerous different types of closely spaced terminals. The small size of the boards, the lack of space between terminals and components and the innumerable solder joints required, made the use of the old type solder irons and solder guns obsolete. New soldering apparatus and techniques were developed to solve the peculiar problems presented by printed circuits.

One of the new techniques utilized for soldering printed circuit boards has been "dip" soldering, wherein the underside of the printed circuit board is momentarily immersed into molten solder. Another new technique is "brush" soldering, wherein molten solder is brushed on the underside of the printed circuit boards. The latest apparatus employed have been wave soldering devices such as described in my copending application "Wave Type Solder Fountain" filed Mar. 22, 1962, and assigned Ser. No. 181,523.

These latest techniques and devices for soldering printed circuit boards are particularly adaptable to mass production, automated methods using in-line equipment for producing completed printed circuit modules. The in-line printed circuit production equipment usually includes at least a pre-heater, a flux applicator, a solder applicator and, in some cases, an after-heater.

As is the case with the solder applicators many different types of flux applicators have been used. In some applicators the flux is poured on a felt pad until the pad is saturated. The underside of the printed circuit board is subsequently pressed against the saturated flux pad. The flux adheres to the raised terminals on the board and it is ready for the soldering operation.

Another technique is to spray the board, after it has been masked or shielded until only the terminals are exposed. If the boards are not masked, a special type solder flux and drying conditions are required to ascertain that the board is not harmed by any corrosive flux solvent. Still another technique immerses the underside of the board in a specially compounded flux designed to readily allow all corrosive flux solvents to escape.

These flux application techniques, however, are not ideally suited for acting on a printed circuit board continuously moving in an assembly line such as used in the in-line printed circuit production equipment. For example, the line would have to be stopped while the printed circuit boards were pressed against the flux saturated pad. The masking operation often necessary in the spray technique has to be accomplished manually and is time consuming. The immersion method requires the conveyor to be engineered with an impractical dip incorporated therein. This necessarily increases the cost of the entire system as well as decreasing the ruggedness and trouble free performance that can be obtained from the system. Also all of the above named devices could cause a greatly excessive volume of applied flux on the printed circuit boards. The excess of flux creates not only a problem in appearance but increases the hazard that there may be retained in all this residue sufficient solvent to cause onerous corrosion and to decrease the resistance value between terminals and between the separate printed wiring.

More recently a foam fluxing technique for applying the flux to the printed circuit board has been developed. In carrying out this method a special solution containing a largely alcoholic solvent and an activated resin flux has been employed. The foam fluxing applicators comprise an inner tank placed within an outer tank containing the liquid flux. The inner tank is constructed so as not to impede the flow of solder flux within the tanks. Submerged in the liquid in the inner tank are porous ceramic or metallic spheres or tubes through which compressed air is introduced. The compressed air causes the flux to bubble up or foam over an orifice at the top of the inner tank. This foam forms a head that is higher than the surface of the liquid flux. The board on the assembly line conveyor belt passes through the head of the foam and is completely wetted with flux without the usual excessive deposits.

One difficulty encountered with the foam fluxing technique and apparatus used heretofore is that the head of foam tends to continue to build up until it overflows the outer tank. To overcome this, the air pressure of the compressed air has to be continuously varied according to the number of units on the assembly line. The necessity of having somebody continuously manipulating the air pressure control valve defeats the purpose of an automated line.

Many devices and methods have been used in attempts to overcome the problems wrought by the superfluous head of foam. For example, an impeller has been placed in the outer tank to maintain the liquid flux in constant motion. This does tend to break the foam bubbles that are in close proximity to the surface of the flux in the outer tank. This impeller method, however, is initially more costly. Even more serious, the constant stirring of the liquid flux by the impeller speeds the evaporation of the solvent, necessitating the continuous addition of solvent to maintain the desired physio-chemical properties of the flux. The change in physio-chemical properties of the flux is also encountered when a fan is used to stir the air around the foam head in an effort to prevent its overflow.

Other attempts to solve the overflow problem have included increasing the dimensions of the outer tank or increasing the height of the orifice of the inner tank above the level of the liquid flux. These solutions increase the space requirements of the in-line production equipment as well as increase the surface area of the solvent exposed to deleterious impurities in the ambient surroundings. This increased surface area also increases the evaporation rate of solvents.

The disadvantages present in all of the foregoing methods and devices of applying solder flux for automatic in-line printed circuit board production, are overcome by the present invention.

Therefore, it is an object of the present invention to provide a new and improved apparatus for efficiently applying solder flux simultaneously to a plurality of closely spaced terminals.

Another object of this invention is to provide a new and improved solder foam fluxing device.

Still another object of this invention is to provide a foam fluxing device wherein the foam is prevented from overflowing without changing the dimensions of the flux containing tank or enhancing the deleterious flux solvent evaporation.

A related object of this invention is to provide a foam fluxing device wherein the deleterious evaporation of the flux solvent in the liquid flux container is minimized.

A more particular object is to provide a foam fluxing device that physically separates the foam from the liquid and still allows liquid from burst foam bubbles to readily drain to the tank thereby reducing the molecular cohesive forces of the fluid and consequently decreasing the life of the foam bubbles and preventing overflow.

Another object of the invention is to provide a screen mesh between the foam bubbles and the liquid flux whereby the foam bubbles are ruptured in passing through the screening.

In accordance with this invention, a screen mesh covers the outer tank. The foam bubbling out of the orifice of the inner tank rests on the mesh which allows excess liquid solder flux to drain back into the tank instead of reinforcing the foam bubbles. In addition, the bubbles resting against the mesh are ruptured by the screen wire. This appreciably shortens the life of the foam head and prevents overflow without any deleterious effect on the physio-chemical properties of the liquid solder flux. An added advantage of the screen cover is that it tends to prevent the premature evaporation of the liquid flux solvent.

Other objects of the invention will become apparent and the invention will be best understood when the following specification is read in conjunction with the accompanying drawings in which.

Figures 1, 2:
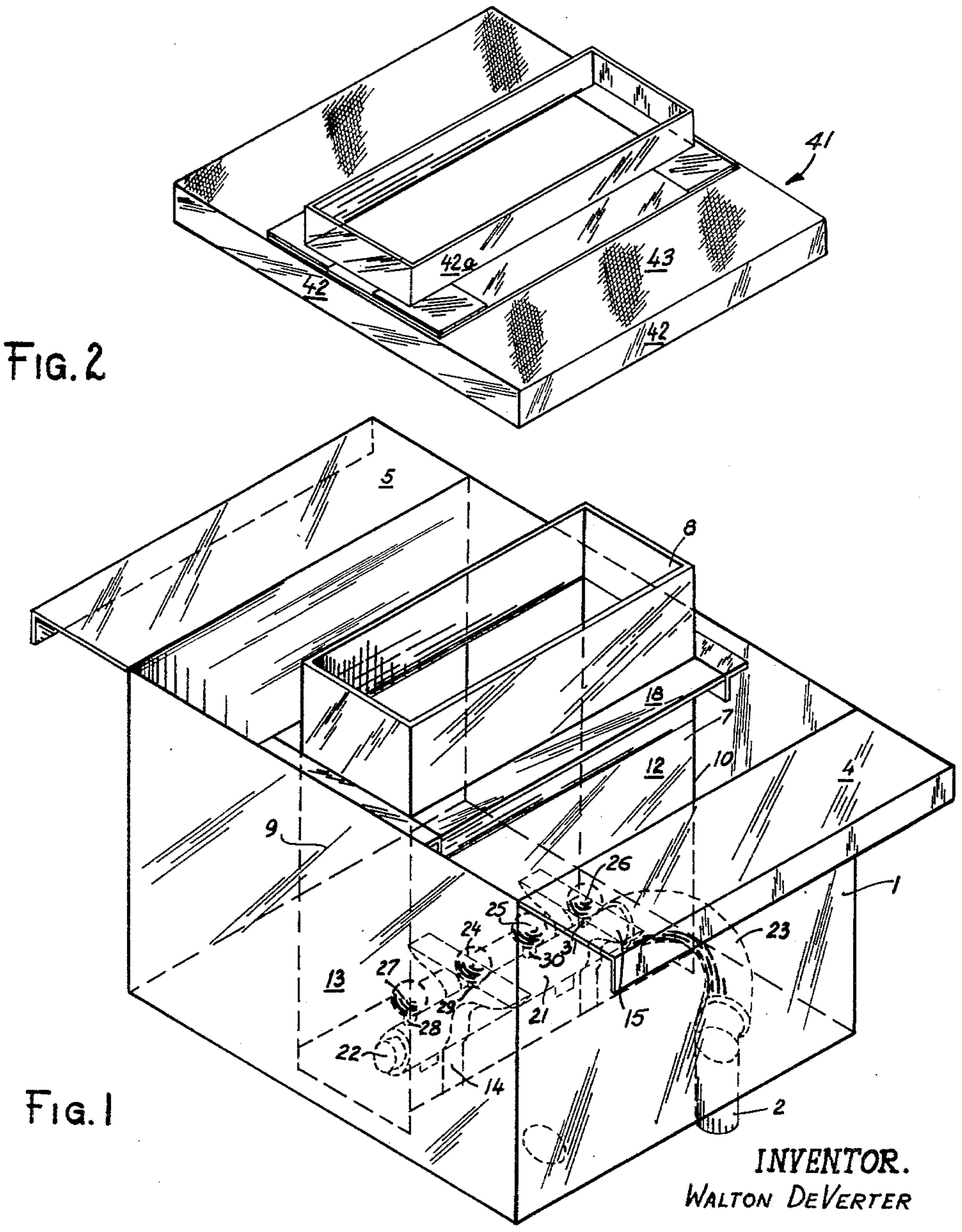
FIG. 1 is a pictorial view of foam fluxing apparatus showing the outer tank and the inner tank with its orifice.
FIG. 2 is a pictorial view of the screen mesh cover of the invention.

By referring to the drawings a description of the operation of the foam fluxing apparatus will be given.

The foam fluxing apparatus comprises an outer tank in which the liquid solder flux is stored. The outer tank comprises air coupling means such as pipe nipple coupling 2 through which the pressurized air is brought and a drain 3 for removing the liquid flux. Flanges 4 and 5 are used to mount the tank in its proper place under a conveyor belt among the in-line printed circuit board production equipment. The tank is constructed from any material, such as stainless steel, which will not be corroded by the flux or will not react chemically with the flux.

An inner tank 7 having an orifice 8 is shown set within the outer tank 1, resting on its longer narrow ends 9 and 10. The wider sides 12 and 13 of the inner tank are shortened to allow the free passage of liquid solder beneath the bottom of those sides.

Fastened to the inner sides of sides 12 and 13 of the inner tank, either by welding or by any well-known fastening devices are spring clips 14 and 15. These clips are fabricated from a resilient material, such as stainless steel spring whose resiliency is not affected by the continuous exposure to the ambient conditions encountered within the tank.

Permanently fastened to the outer sides of the inner tank 7 are flanges 18 which serve as a rest for the cover shown in FIG. 2. The flanges are conveniently placed at the level of the liquid flux about three-fourths of the way up from the bottom toward the top of the inner tank; so that most of the tank is below the flanges.

A compressed air passage pipe 21 is mounted within the inner tank and held in place by springs 14 and 15. The pipe is closed at one end by plug 22. The other end is connected to the air inlet by means, such as plastic tubing 23. Porous ceramic spheres 24–27 are attached with threaded nipples to the tapped holes 28–31 located on the topside of the pipe. The ceramic spheres serve to allow the passage of compressed air into the liquid flux in a manner conductive to forming foam bubbles. The spheres also act to prevent the denser liquid from entering the air storage tanks. The spheres 24–27 are shown relatively small in diameter for purposes of clarity, in actuality they may be larger to produce more foam bubbles. Also it should be understood that any bubble producing means could be used without affecting the scope of this invention.

The inner tank 12 is held in place in the outer tank 1 by the cover unit 41 shown in FIG. 2. This unit comprises a frame 42, **42*a* dimensioned to slip fit within the outer tank and over the inner tank, respectively. The unit rests on flanges 18 of the inner tank. Stretched over the frame is a wire mesh 43. When the cover unit is placed over the inner tank 12 and within the outer tank 1** the orifice of the inner tank protrudes through the cover which rests a minute amount above the liquid level.

In operation the flux foaming apparatus is put in its proper place among the automatic in-line printed circuit board production equipment. Generally, the line comprises at least a pre-heater for heating the board to a proper temperature; a flux applicator such as flux foamer for covering the surfaces to be soldered with flux; a solder applicator, such as a wave type solder fountain for accomplishing the desired soldering; and, in some instances, an after-heater for drying the boards and ascertaining that any deleterious flux solvent has been effectively volatized. Above this equipment, that is arranged in a substantially straight line, is a conveyor belt from which the printed circuit boards are suspended in specially designed harnesses.

Pipe 21 with its porous ceramic spheres is snapped into place in the inner tank which is set into the outer tank 1. Liquid flux is poured into the outer tank 1 of the flux foamer until the surface of the liquid is at a level that is slightly below the bottom of flange 18 of inner tank 12. The cover unit 41 is slipped into position above the liquid surface. Compressed air at a regulated pressure, of approximately three pounds per square inch, is connected to air inlet 32. The compressed air passes into the liquid flux in the inner tank through tygon tube 23, pipe 21 and porous ceramic spheres 24–27. The compressed air when passing through the spheres into the liquid flux forms numerous small bubbles which push to the top of the fluid in the inner tank 12. The first formed bubbles are raised out of the liquid and lifted up through orifice 8 by continually forming new bubbles. Soon a foam bubble head overflows the orifice and is pushed progressively toward the screen of the cover 41. The printed circuit boards passing through the head of foam, break many of the bubbles and obtain a thorough wetting with flux, yet are not coated with an excess of flux.

The screen expedites the destruction of the bubbles to prevent the foam from overflowing the outer tank. The broken foam bubbles return to the liquid in the tank to repeat the foaming cycle. Experiments have shown that the screen works best when its hole sizes are slightly smaller than the average diameter of the foam bubble. A preferred embodiment of the invention utilizes a number fourteen mesh screen.

The screen mesh operates to destroy the foam bubbles in two ways. First, the screen prevents the overflow bubbles from coming into direct contact with the liquid flux. Since these bubbles are not re-inforced by the liquid; their molecular cohesive force is decreased thereby reducing the surface tension of the liquid forming the bubbles. This reduction of the surface tension causes the bubbles to burst.

Second, the screen mesh openings are smaller than the diameter of the average bubble. Therefore, when the foam bubbles resting against the screen are forced through the screen by the pressure of the foam head, they are ruptured and destroyed. When fewer boards pass through the foam head, more foam builds up to cause a greater pressure on the foam adjacent to the screen mesh and hence destroys more foam bubbles by forcing them through the screening. Thus, the screen mesh prevents the foam from overflowing but does not decrease the effective density or height of the foam head.

In addition the screen hampers the evaporation of the flux solvent by providing a cover over the liquid flux. This screen covering tends to prevent evaporation because the volatile solvent is stopped from escaping into the atmosphere. Also the screen prevents unsaturated ambient atmosphere from coming into contact with the liquid flux thus further preventing evaporation.

While I have disclosed my invention in connection with specific apparatus and applications, it is to be clearly understood that this description is made only by way of example and not as a limitation on the scope of the invention.

What is claimed is:

1. A foam fluxing applicator comprising a first tank for storing liquid solder flux, a second tank within said first tank, said second tank having walls extending above the maximum level of said stored liquid, means in said walls for permitting the free passage of said liquid from said first tank to said second tank, means within said second tank for generating foam bubbles and for causing said foam bubbles to overflow said second tank toward said liquid in said first tank and mesh means resting on said second tank for keeping the overflowing foam bubbles separate from the liquid flux in said first tank.

2. A foam fluxing applicator as set forth in claim 1 wherein the last named means is detachable from said first and second tanks.

3. A foam fluxing applicator comprising a first tank for storing liquid solder flux, a second tank within said first tank, said second tank having walls extending above the maximum level of said stored liquid, means in said walls that allows free passage of said liquid from said first tank to said second tank, means in said second tank for generating a head of foam bubbles which rises above the top of said second tank, and means for preventing the foam bubbles from coming into contact with the liquid flux in said first tank but allowing liquid flux from said bubbles that have burst to pass into said liquid in said first tank.

4. A foam fluxing applicator comprising a first tank for storing liquid solder flux, a second tank within said first tank, said second tank having walls extending above the maximum level of said stored liquid, means in said walls that allows free passage of said liquid from said first tank to said second tank, means in said second tank for generating a head of flux foam bubbles that rises above the liquid level in said second tank, orifice means in said second tank for directing the rise of said flux foam bubble head above the top of said first tank, and means for maintaining said foam bubbles and said liquid flux in said first tank separate.

5. A foam fluxing applicator comprising a first tank for storing liquid solder flux, a second tank within said first tank, means in said second tank for allowing the passage of liquid flux between said first tank and said second tank, means in said second tank for generating a head of flux foam bubbles, orifice means in said second tank for directing the rise of said head above the top of said first tank, and means covering the liquid in said first tank for automatically preventing said head from overflowing said first tank.

6. A foam fluxing applicator for automatically applying solder flux to printed circuit boards passing above said applicator on a conveyor belt line comprising a first tank; a second tank within said first tank comprising: means for allowing the passage of liquid flux from said first tank to said second tank, means for generating a head of flux foam bubbles above the liquid in said second tank, means for causing the head to rise above the level of said first tank and overflow toward the liquid in said first tank; and mesh means covering said liquid in said first tank for preventing the foam from overflowing said first tank.

7. A foam fluxing applicator for automatically applying solder flux to printed circuit boards passing above said applicator comprising a first tank for storing liquid flux; a second tank within said first tank comprising: means for allowing the passage of liquid flux from said first tank to said second tank, means for generating a head of flux foam bubbles above the liquid in said second tank, and orifice means for causing the head to rise above the level of said first tank and overflow toward said liquid in said first tank; and mesh means for covering the liquid in said first tank, the said mesh comprising openings smaller than the average size of the bubbles in said foam bubble head.

8. A foam fluxing applicator for applying solder flux to printed circuit boards passing above said applicator on a conveyor belt line comprising a first tank for storing liquid flux; a second tank within said first tank comprising: means for allowing the free passage of liquid flux from said first tank to said second tank, porous means for passing compressed air into said second tank to generate flux foam bubbles, orifice means for causing said flux foam bubbles to rise higher than both said tanks and overflow toward said liquid in said first tank; and screen mesh means for covering the liquid in said first tank, the said mesh means comprising openings smaller than the average size of said bubble in said foam.

References Cited by the Examiner

UNITED STATES PATENTS

| | | | |
|---|---|---|---|
| 2,488,876 | 11/49 | Newhall et al. | 259—9 |
| 2,649,758 | 8/53 | Cowgill et al. | 252—361 X |
| 2,668,796 | 2/54 | Wehmiller et al. | 252—361 X |
| 2,993,272 | 7/61 | Carlzen et al. | 113—93 X |
| 3,047,418 | 7/62 | Compton | 117—37 |

WHITMORE A. WILTZ, *Primary Examiner.*

JOHN F. CAMPBELL, CHARLES W. LANHAM, *Examiners.*